United States Patent
Shah et al.

(10) Patent No.: US 8,638,165 B2
(45) Date of Patent: Jan. 28, 2014

(54) SWITCHED-CAPACITOR DC BLOCKING AMPLIFIER

(75) Inventors: Peter J Shah, San Diego, CA (US); Shahin Mehdizad Taleie, Laguna Nigel, CA (US); Gerrit Groenewold, Ramona, CA (US); Guoqing Miao, San Diego, CA (US); Eunyung Sung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 192 days.

(21) Appl. No.: 13/271,130

(22) Filed: Oct. 11, 2011

(65) Prior Publication Data

US 2012/0306575 A1    Dec. 6, 2012

Related U.S. Application Data

(60) Provisional application No. 61/493,949, filed on Jun. 6, 2011, provisional application No. 61/493,951, filed on Jun. 6, 2011, provisional application No. 61/493,953, filed on Jun. 6, 2011, provisional application No. 61/504,680, filed on Jul. 5, 2011.

(51) Int. Cl.
    *H03F 1/02*      (2006.01)

(52) U.S. Cl.
    USPC .................................. 330/9; 330/69; 330/258

(58) Field of Classification Search
    USPC ................................................ 330/9, 69, 258
    See application file for complete search history.

(56) References Cited

U.S. PATENT DOCUMENTS

| | | | | |
|---|---|---|---|---|
| 4,224,581 A * | 9/1980 | Watanabe et al. | ............... | 333/14 |
| 4,593,250 A | 6/1986 | Lucas et al. | | |
| 4,599,573 A | 7/1986 | Senderowicz | | |
| 4,769,612 A * | 9/1988 | Tamakoshi et al. | ........... | 327/554 |
| 5,477,481 A * | 12/1995 | Kerth | ............................. | 708/819 |
| 5,680,072 A * | 10/1997 | Vulih et al. | ................... | 327/554 |
| 6,035,049 A | 3/2000 | Engh et al. | | |
| 6,329,939 B1 * | 12/2001 | Swaminathan et al. | ...... | 341/143 |
| 6,411,717 B1 | 6/2002 | Lubbe et al. | | |
| 6,570,519 B1 * | 5/2003 | Yang | ............................. | 341/143 |

(Continued)

FOREIGN PATENT DOCUMENTS

| | | |
|---|---|---|
| GB | 2159014 A | 11/1985 |
| JP | 2002204144 A | 7/2002 |
| JP | 2006148320 A | 6/2006 |

OTHER PUBLICATIONS

Ramirez-Angulo, et al. "A new family of very low-voltage analog circuits based on quasi-floating-gate transistors," Circuits and Systems II: Analog and Digital Signal Processing, IEEE Transactions, May 2003, pp. 214-220, vol. 50, No. 5.

(Continued)

*Primary Examiner* — Patricia Nguyen
(74) *Attorney, Agent, or Firm* — Ramin Mobarhan

(57) ABSTRACT

A switched-capacitor DC blocking amplifier is disclosed. In an embodiment, an integrated circuit is provided that includes an amplifier having an amplifier input and an amplifier output, a capacitor connected to the amplifier input and configured to receive an input signal, and a switched capacitor circuit coupled to provide a resistance between the amplifier input and the amplifier output. In one implementation, the switched capacitor circuit is configured with a feed forward circuit to reduce aliasing. In another implementation, the switched capacitor circuit includes a switched impedance circuit to reduce noise.

19 Claims, 10 Drawing Sheets

(56) References Cited

U.S. PATENT DOCUMENTS

| | | | |
|---|---|---|---|
| 6,573,785 | B1 | 6/2003 | Callicotte et al. |
| 7,336,460 | B2 | 2/2008 | Dournelle et al. |
| 7,633,778 | B2 | 12/2009 | Mok et al. |
| 7,683,815 | B2 | 3/2010 | Josefsson et al. |
| 7,880,538 | B2 * | 2/2011 | Sharma .............................. 330/9 |
| 8,130,127 | B1 * | 3/2012 | Tsang et al. .................. 341/143 |
| 2010/0327965 | A1 | 12/2010 | Fagg |

OTHER PUBLICATIONS

Ramirez-Angulo, et al., "Very low-voltage analog signal processing based on quasi-floating gate transistors," IEEE Journal of Solid-State Circuits, Mar. 2004, pp. 434-442, vol. 39, No. 3.

Allen, et al., "CMOS Analog Circuit Design," Second Edition, Jan. 2002, pp. 493-544.

International Search Report and Written Opinion -PCT/US2012/041170—ISA/EPO—Dec. 20, 2012.

Verma N et al., "A Micro-Power EEG 1-5, Acquisition SoC With Integrated Feature, Extraction Processor for a Chronic Seizure Detection System", IEEE Journal of Solid-State Circuits, IEEE Service Center, Piscataway, NJ, USA, vol. 45, No. 4, Apr. 1, 2010, pp. 804-816, XP011305763.

Yin M et al., "A Low-Noise Preamplifier with Adjustable Gain and Bandwidth for Biopotential Recording Applications", Circuits and Systems, 2007. ISCAS 2007. IEEE International Symposium 0 N, IEEE, PI, May 1, 2007, pp. 321-324, XP031181262.

Yoshizawa H. et al., MOSFET-Only Switched-Capacitor in Digital CMOS Technology, IEEE Journal of Solid-State Circuits, IEEE Service Center, Piscataway, NJ, USA, vol. 34, No. 6, Jun. 1, 1999, XP011061030.

Zou X et al., "A 1-V 450-nW Fully Integrated Programmable Biomedical Sensor Interface Chip", IEEE Journal of Solid-State Circuits, IEEE Service Center, Piscataway, NJ, USA, vol. 44, No. 4, Apr. 1, 2009, pp. 1067-1077, XP011254339.

* cited by examiner

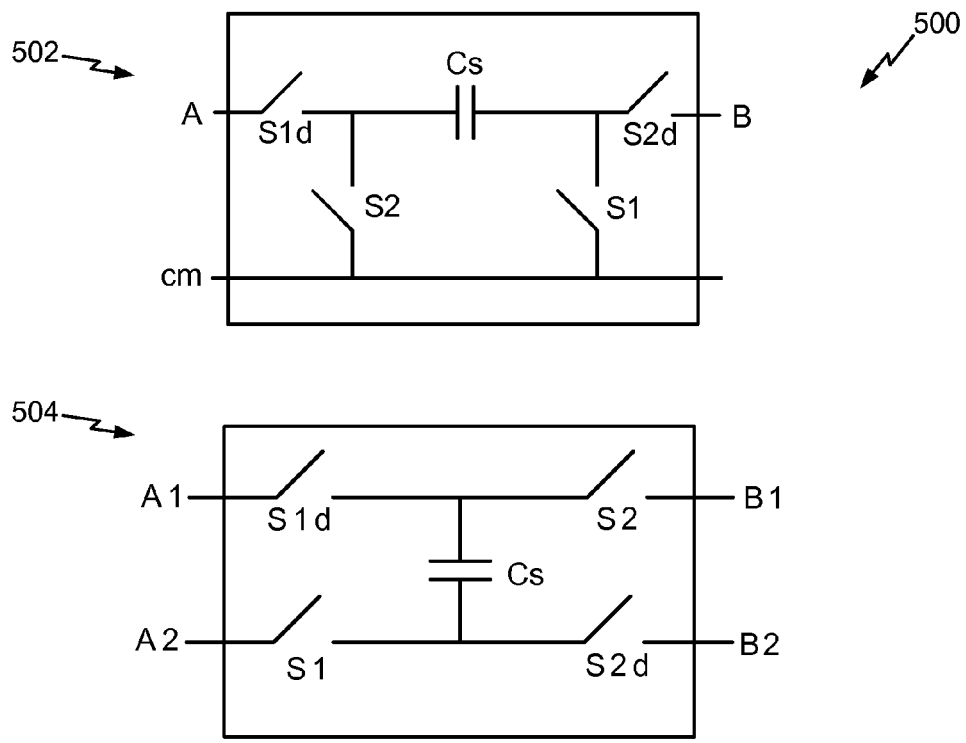
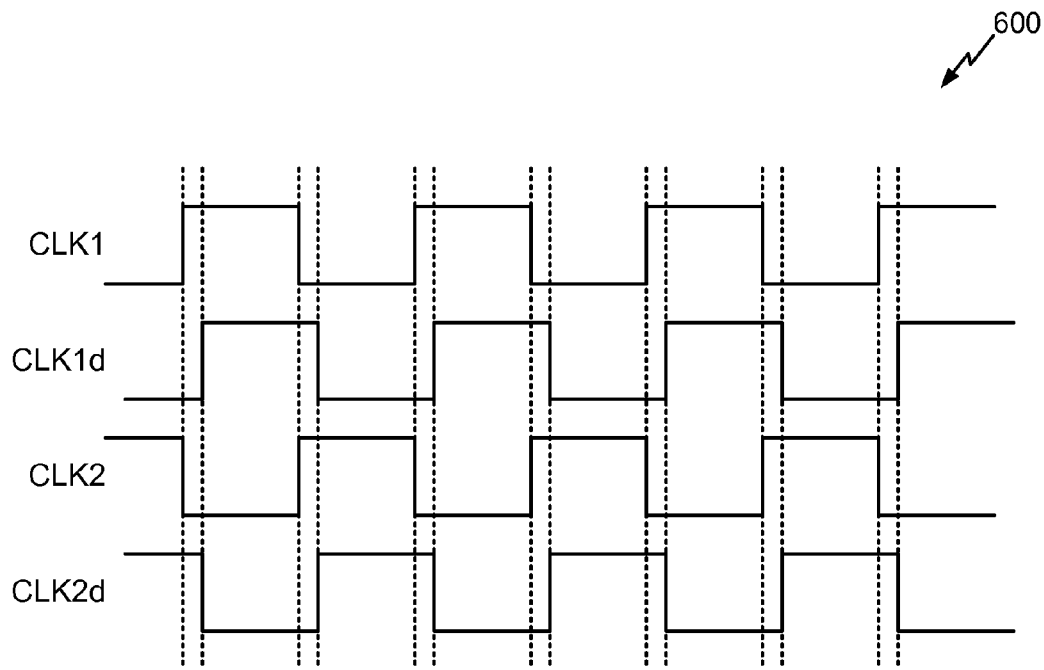
*FIG. 5*
*FIG. 6*

SWITCHED-CAPACITOR DC BLOCKING AMPLIFIER

CLAIM TO PRIORITY

This patent application claims the benefit of priority from U.S. Provisional Patent Application No. 61/493,949, entitled "SWITCHED-CAPACITOR DC BLOCKING AMPLIFIER" filed on Jun. 6, 2011, and assigned to the assignee hereof and hereby expressly incorporated by reference herein.

This patent application claims the benefit of priority from U.S. Provisional Patent Application No. 61/504,680, entitled "SWITCHED-CAPACITOR DC BLOCKING AMPLIFIER" filed on Jul. 5, 2011, and assigned to the assignee hereof and hereby expressly incorporated by reference herein.

This patent application claims the benefit of priority from U.S. Provisional Patent Application No. 61/493,951, entitled "POWER SUPPLY NOISE REJECTION AND DISTORTION IN PROGRAMMABLE GAIN AMPLIFIERS" filed on Jun. 6, 2011, and assigned to the assignee hereof and hereby expressly incorporated by reference herein.

This patent application claims the benefit of priority from U.S. Provisional Patent Application No. 61/493,953, entitled "SUPPRESS ALIASES IN SWITCHED CAPACITOR CIRCUITS" filed on Jun. 6, 2011, and assigned to the assignee hereof and hereby expressly incorporated by reference herein.

BACKGROUND

1. Field

The present application relates generally to the operation and design of amplifiers, and more particularly, to integrated amplifiers that reduce external components.

2. Background

There is an increasing demand to provide high quality audio and video from a variety of user devices. For example, handheld devices are now capable of rendering high definition video and outputting high quality multichannel audio. Such devices typically require audio amplifiers that are designed to provide high quality signal amplification.

In a typical device implementation, an integrated amplifier with high-pass filtering is provided for audio applications. For example, the high-pass filtering removes DC components from a microphone input signal before amplification. The high-pass filtering may utilize off-chip DC blocking capacitors. The off-chip DC blocking capacitors increase the bill of materials (BOM), cost, and circuit board area of the system; especially if there are multiple stereo channels in the system.

Therefore, it would be desirable to eliminate the off-chip DC-blocking capacitors used with an integrated amplifier, thereby reducing the BOM, cost, and required board area of the system.

BRIEF DESCRIPTION OF THE DRAWINGS

The foregoing aspects described herein will become more readily apparent by reference to the following description when taken in conjunction with the accompanying drawings wherein:

FIG. 5 illustrates exemplary switched capacitor circuits;

FIG. 6 shows exemplary clocking signals used to operate the switches of the switched capacitor circuits shown in FIG. 7;

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
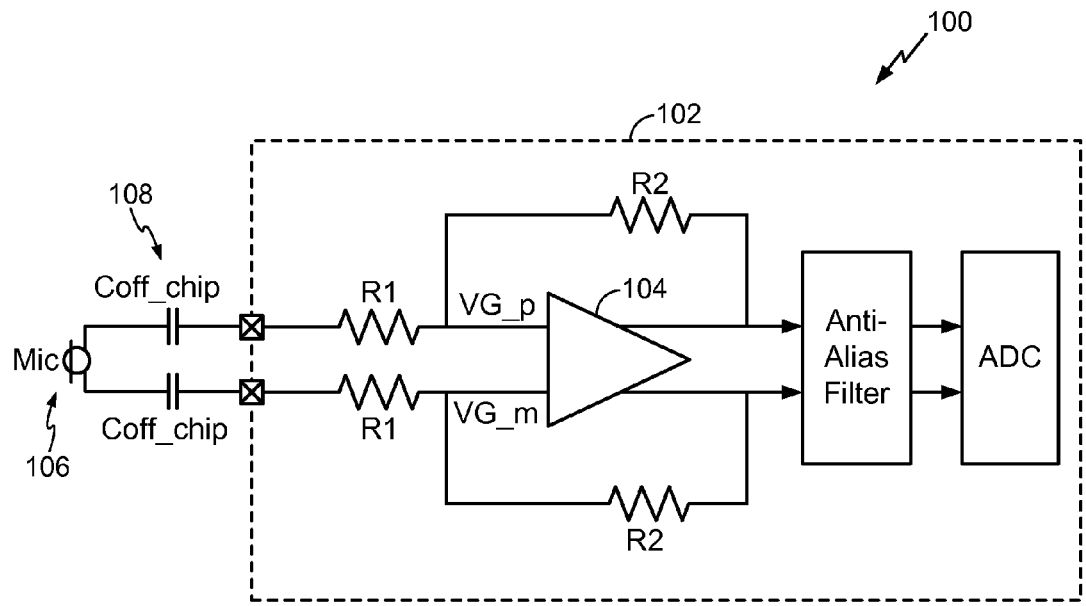
FIG. 1 shows a conventional amplifier circuit for use in a device.

FIG. 1 shows a conventional amplifier circuit 100 for use in a device. For example, the circuit 100 is suitable for use in a mobile phone. The circuit 100 comprises an integrated circuit 102 that includes amplifier 104 and associated processing circuits. Audio signals from microphone 106 are coupled to the circuit 100 though external DC blocking capacitors 108. For example, the external capacitors 108 remove DC components of the microphone signal before signal amplification. Unfortunately, the external capacitors 108 increase the BOM, cost, and board area of the circuit 100, especially if there are multiple stereo channels in the device. Thus, it is desirable to eliminate the off-chip components, such as DC-blocking capacitors, to reduce the BOM, cost, and required circuit area.

Switched Capacitor Circuit used for High Resistance

In exemplary embodiments, a DC blocking amplifier is provided that comprises on-chip capacitors and a switched capacitor circuit to create a high resistance for biasing the input of the amplifier while overcoming aliasing, common-mode range, and distortion problems. As a result, the off-chip components, BOM, cost, and required circuit area are reduced.

Figure 2:
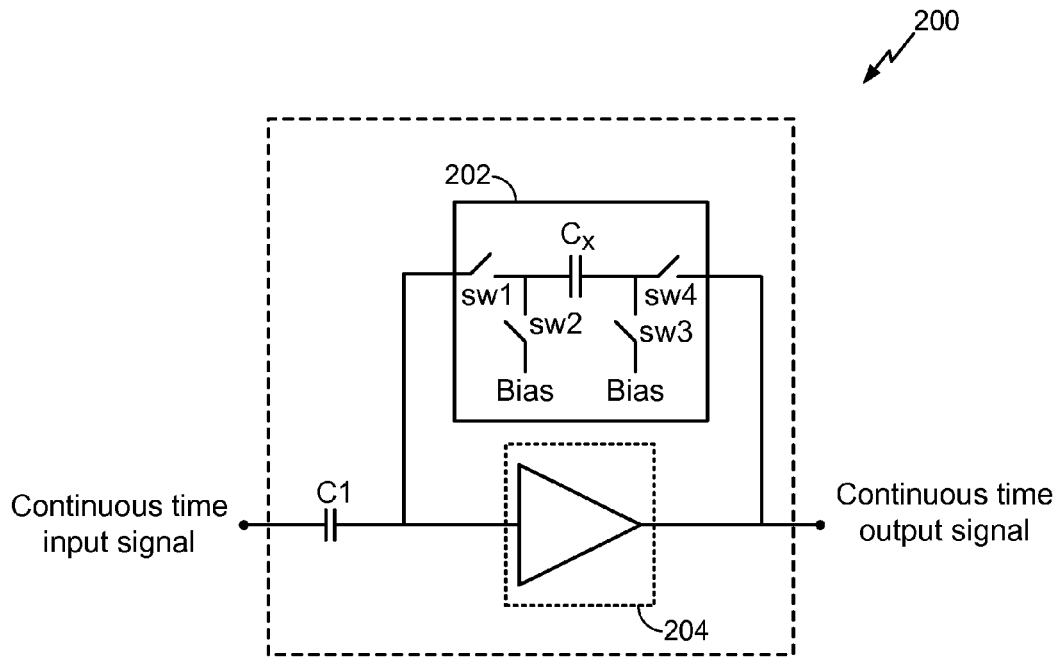
FIG. 2 shows an exemplary integrated amplifier circuit with a switched capacitor circuit providing a large on-chip resistance.

FIG. 2 shows an exemplary integrated amplifier circuit 200 comprising a switched capacitor circuit 202 providing a large on-chip resistance. The amplifier circuit 200 comprises an on-chip capacitor (C1) connected to the input of an amplifier 204. The switched capacitor circuit 202 comprises a capacitor Cx coupled to four switches (sw1-sw4) that are operated at a sampling frequency (fs) by a switch control circuit (not shown). As disclosed below, the switched capacitor circuit 202 is suitable for use to provide a large resistance to bias the amplifier 204.

The capacitor C1 is coupled to receive a continuous time input signal. The amplifier 204 comprises an opamp, buffer, gain stage, or other suitable amplifier. The switched capacitor circuit 202 is connected between the input and output of the amplifier 204. The output of the amplifier 204 outputs a continuous time output signal that is an amplified version of the input signal. The switches of the switched capacitor circuit 202 are operated at the sampling frequency (fs) so as to provide a large equivalent resistance determined from the expression $R=[1/(fs*C_x)]$ to bias the amplifier 204. For example, in one embodiment, the switched capacitor circuit 202 provides a resistance value that is greater than 100 megaohms. Thus, the amplifier circuit 200 is suitable for use in a device provide amplification while reducing or eliminating the need for off-chip external components.

Figure 3:
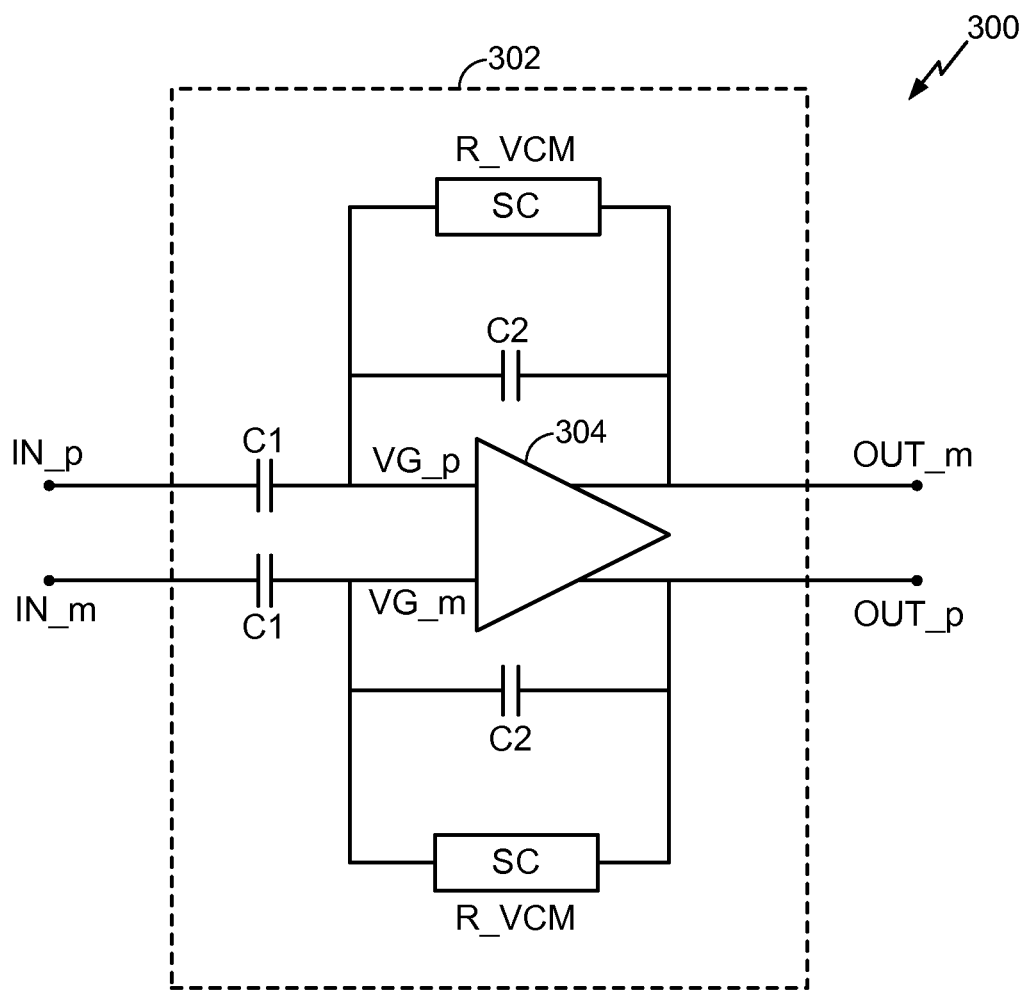
FIG. 3 shows an exemplary integrated differential amplifier circuit with switched capacitor circuits providing large on-chip resistances.

FIG. 3 shows an exemplary amplifier circuit 300 with integrated input capacitors and large on-chip resistances. The circuit 300 comprises an integrated circuit 302 that includes amplifier 304. The circuit 300 also includes switched capacitor (SC) circuits that provide resistance values (referred to herein as R_VCM) that are in the feedback paths of the amplifier 304. For example, in an exemplary embodiment, the SC circuits provide large resistance values in the Giga-Ohms range.

The circuit 300 also includes DC blocking capacitors (C1) that are not external, but have been moved onto the integrated circuit 302. By moving the external capacitors onto the integrated circuit 302, the BOM, cost and board area of the circuit have been reduced.

If the SC circuits are not used to provide a large resistance value, the circuit 200 may suffer from an undefined input common-mode voltage. That is, the common mode of the amplifier 304 is not defined and it can become any voltage as high as the supply voltage or even higher, or as low as the ground voltage or even lower. This undefined common mode voltage for any amplifier, either an opamp or operational transconductance amplifier (OTA), is prohibitively impossible to implement in integrated circuits. Thus, the large resistances values provided by the SC circuits set the input common-mode voltage of the amplifier 304 and address the issue of an undefined input common-mode voltage.

Figure 4:
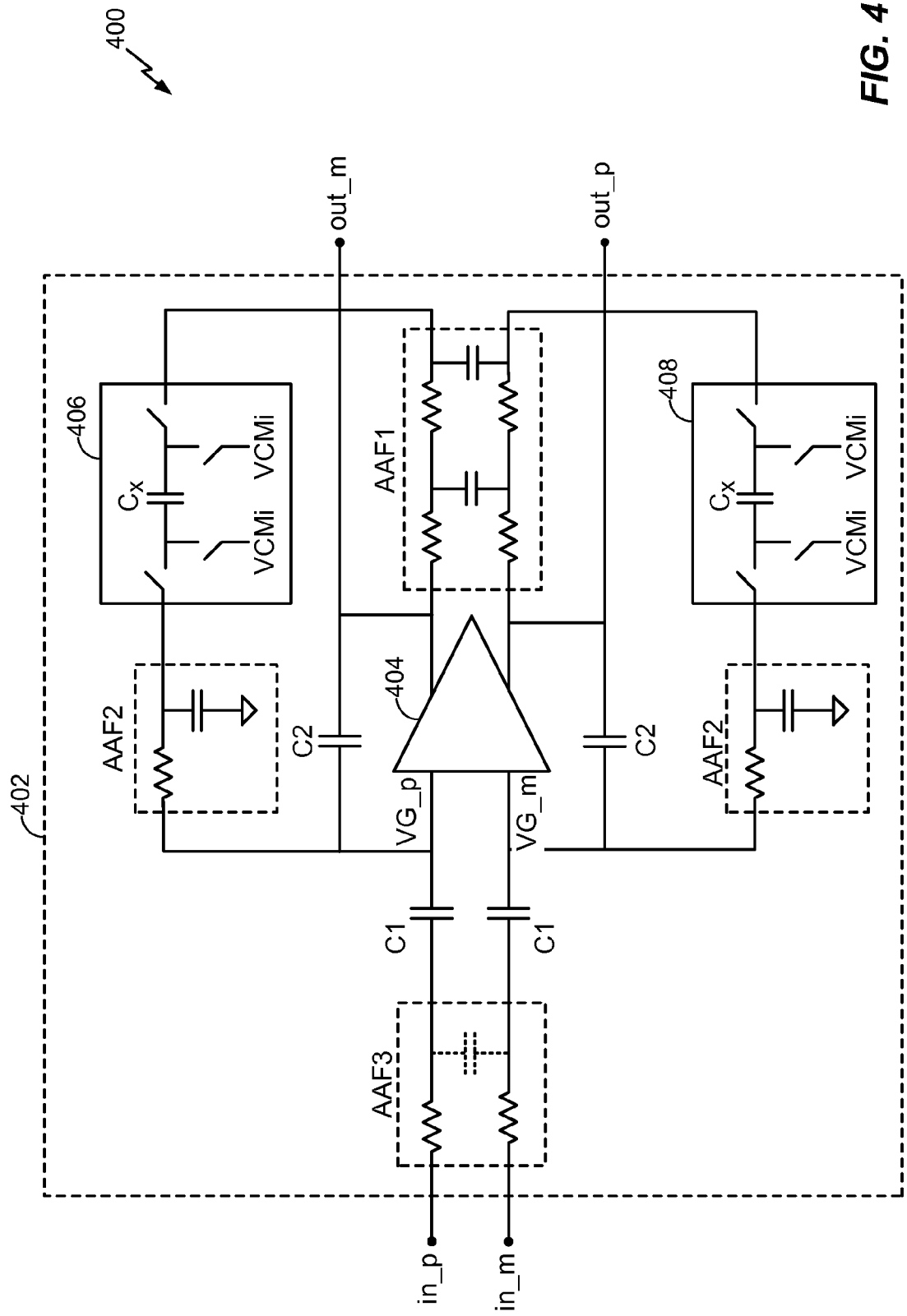
FIG. 4 shows an exemplary integrated differential amplifier circuit with switched capacitor circuits providing large on-chip resistances.

FIG. 4 shows an exemplary integrated differential amplifier circuit 400 with switched capacitor circuits providing large on-chip resistances (R_VCM). The circuit 400 comprises integrated circuit 402 that includes amplifier 404. The integrated circuit 402 includes switch capacitor circuits 406 and 408 that are connected into the feedback paths of the amplifier 404. Also shown are optional anti-aliasing filters AAF1-AAF3. It should be noted that while a differential amplifier 404 is shown in FIG. 4, the circuit can be configured for use with a single ended amplifier.

During operation, the input of the switched capacitor circuits 406, 408 are selectively connected to a virtual ground, (VCMi) thus reducing or eliminating the signal swing and also any aliasing and distortion at one end of the switched capacitor circuits 406, 408. The other end of the switched-capacitor circuits 406, 408 are still subjected to the signal swing at the amplifier 404 output, but as this is away from the input, the aliasing concern can be addressed by adding the optional anti-aliasing filter, shown as AAF1. In an exemplary embodiment, the distortion issue can be resolved by appropriately phasing the clock signals for the different switches in the switched capacitor circuit 400, 408, as known in the art.

In an exemplary embodiment, any remaining distortion and/or aliased signals will undergo low-pass filtering with a corner frequency of 1/(R_VCM*C2). Since this is the same as the high-pass corner frequency that the input signal will be subjected to, it will be below the lowest signal frequency of interest and distortion products inside the frequency band of interest will be attenuated.

In an exemplary embodiment, the large resistances provided by the switched capacitor circuits 406, 408 are determined from 1/(fs*Cx) and therefore the pole frequency of the high-pass filter becomes fs*Cx/C2, which is process independent, and can be adjusted by changing Cx or more advantageously the sampling frequency fs of the switched capacitor circuits. For example, the corner frequency of the high pass filter can be set anywhere in the range of 2 Hz to 40 kHz, and in one embodiment, is set in the range of 2 Hz to 2 Khz.

If the amplifier 404 is ideal and has infinite gain and bandwidth there will be no adverse effect due to aliasing of signals at its input because there will be zero swing at all frequencies. In reality, the amplifier 404 has a finite gain bandwidth product and therefore for high frequencies the loop gain drops and if there are substantial high-frequency components present in the input signal, they may cause some amount of signal swing across the virtual grounds. If the high-frequency components are sufficiently close in frequency to multiples of the sampling frequency, the switched-capacitor circuits 406, 408 will alias these down into the frequency band of interest. In order to reduce the aliasing of high frequency signals sampled at the input of the amplifier 404, the optional anti-aliasing filters (AAF2) can be placed at the input before the switched capacitor circuits 406 and 408.

In an exemplary embodiment, the high-frequency components can be filtered directly at the input by adding the optional anti-alias filter AAF3. In an exemplary embodiment, the filter AAF3 comprises just resistors in series with the C1 capacitors. In another exemplary embodiment, some or all the anti-alias filters can advantageously be implemented with resistors and/or capacitors.

The switched-capacitor circuits 406, 408 may have large equivalent voltage noise but that noise is low-pass filtered with a pole frequency of 1/(R_VCM*C2), which as previously explained is below the frequency band of interest. Hence the noise is filtered as well and the resulting noise contribution can be made insignificant by choosing a low enough corner frequency.

As described above, exemplary embodiments provide a hybrid of continuous-time filtering and switched capacitor circuits to provide on-chip amplification and DC blocking. The embodiments also provide DC blocking with a process insensitive corner frequency and alias suppression to make the amplifier less susceptible to high frequency unwanted signals.

Aliasing Suppression

The following is a description of exemplary embodiments of aliasing suppression that operate to reduce aliasing. For example, the aliasing suppression can be used with switched capacitor circuits that are part of any mixed-signal or RF circuit. For example, the disclosed aliasing suppression can be used in the Hybrid DC-Blocking amplifier 400 shown in FIG. 4, where switched capacitor circuits are used to create large resistances. The aliasing caused by sampling can reduce dynamic range and since this circuit is at the front end and before the analog to digital conversion (ADC) anti-aliasing filter, an extra stage of anti-aliasing may become necessary to attenuate aliases. The aliasing suppression described below attenuates aliases in a very cost efficient way.

FIG. 5 illustrates exemplary switched capacitor circuits 500. For example, the switched capacitor circuit 502 is reconfigured into the switch capacitor circuit 504. During reconfiguration, the common-mode (cm) node of circuit 502 is split into the pins A2 and B1 of circuit 504, and pins A and B of circuit 502 become pins A1 and B2 of circuit 504, respectively.

FIG. 6 shows exemplary clocking signals 600 used to operate the switches of the switched capacitor circuits shown in FIG. 5. Using the clocking signals 700 to operate the corresponding switches of the switched capacitor circuit 504, the resulting feed-forward operation reduces the aliasing of hybrid circuits and can be used in any type of switched capacitor circuit. The presented circuit suppresses signals in undesired frequencies by placing those signals on both plates of the sampling capacitor Cs during half the clock cycle.

This operation results in significant alias suppression depending on the frequency of operation and capacitor ratios, for example, approximately 30 dB of suppression is obtained in one implementation. As a result, higher dynamic range can be achieved by using less area than with other analog anti-alias filters that may be used.

Figure 7:
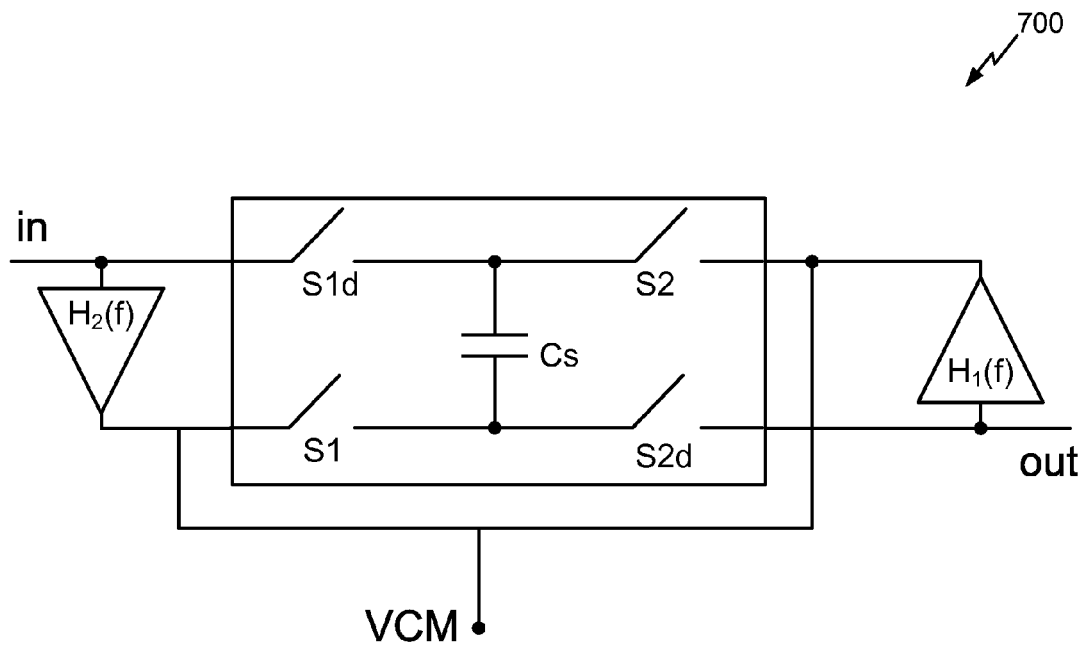
FIG. 7 illustrates an exemplary feed-forward circuit.

FIG. 7 illustrates an exemplary feed-forward circuit 700. The circuit 700 comprises the filters $H_1(f)$ and $H_2(f)$ that suppress aliasing at both "in" and "out" sides of the circuit 700. These two filters could be used individually or both can be present. In various implementations, the filters could be high-pass, low-pass, bandpass or band-reject. The alias suppression takes place in the passband, i.e. wherever it has a gain close to 1. Each filter ($H_1(f)$, $H_2(f)$) is designed such that it has high impedance for the desired frequency range, and low impedance for the undesired frequency range. Any signal that is in the passband of filters will be present at both plates of the sampling capacitor Cs during phase 2 or phase 1 of the clock cycle, and therefore the corresponding sampled voltage on the capacitor for that frequency range cancels out and is therefore not aliased. At the same time, each filter attenuates signals in the desired frequency range such that the desired signal is not subtracted from itself through the feed-forward path.

Figure 8:
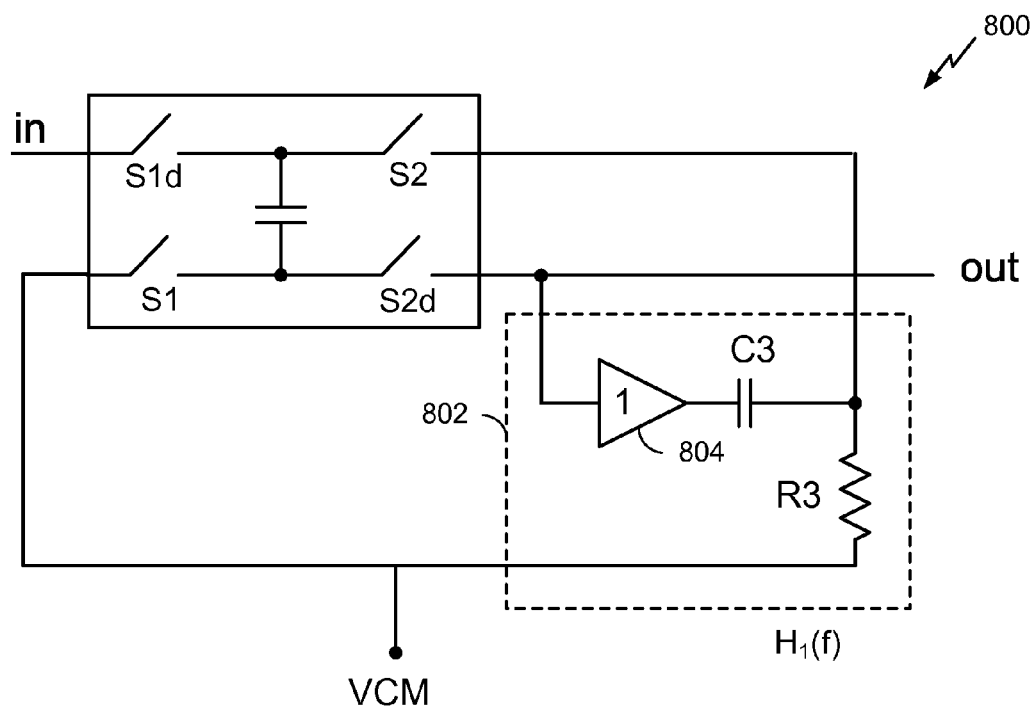
FIG. 8 illustrates an exemplary feed forward circuit comprising a first order high-pass filter.
Figure 9:
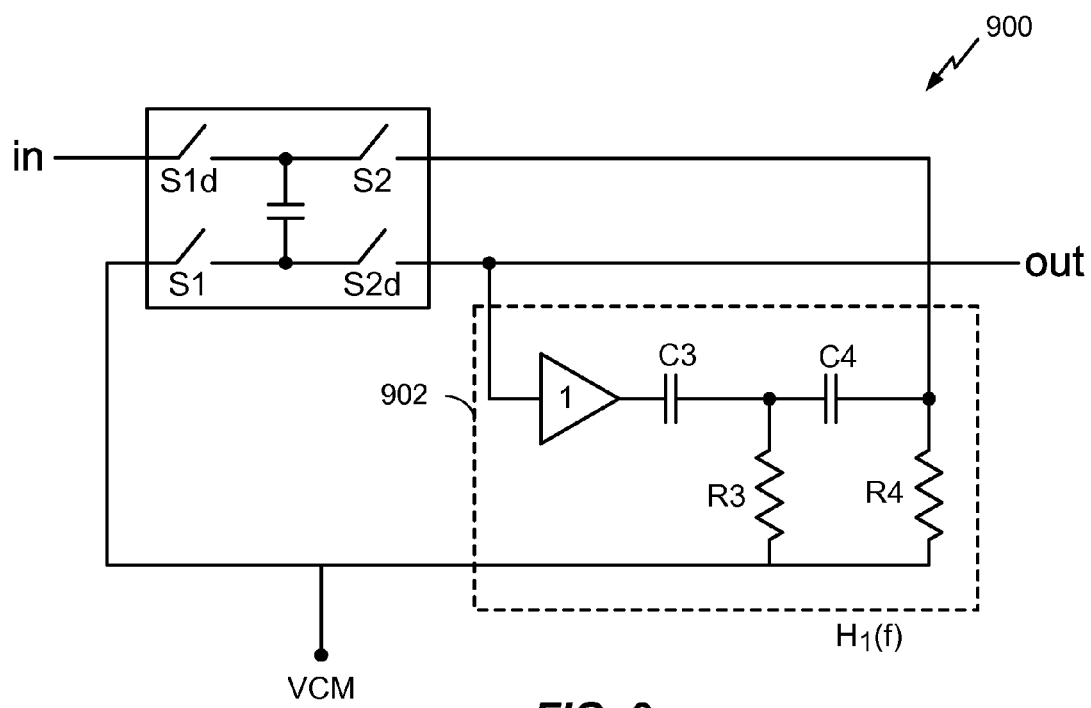
FIG. 9 illustrates an exemplary feed forward circuit comprising a second order high-pass filter.
Figure 10:
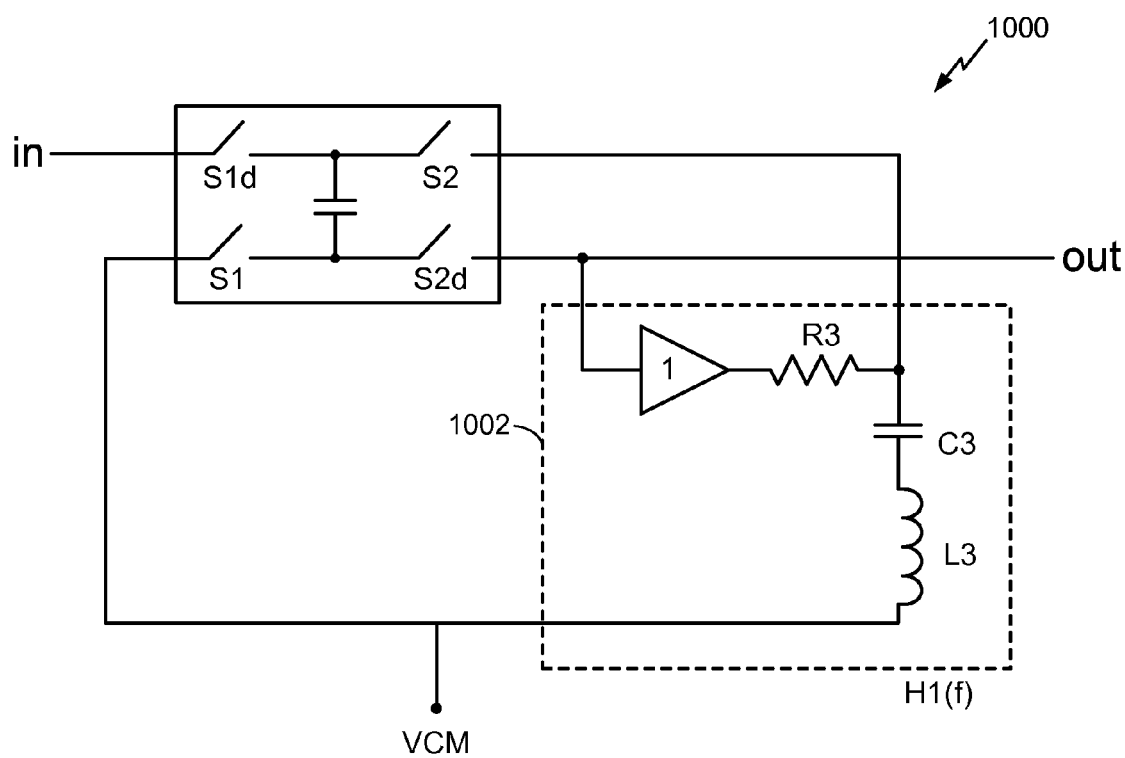
FIG. 10 illustrates an exemplary feed forward circuit comprising a band-stop filter.

FIGS. 8-10 illustrate various exemplary embodiments of the feed forward circuit of FIG. 7. In the implementations below only one filter is shown for simplicity, however, each implementation may comprise an additional filter as described above.

FIG. 8 illustrates an exemplary feed forward circuit 800 comprising a first order high-pass filter $H_1(f)$ 802. The feed forward circuit 800 can be used for sampling a low frequency (baseband) signal and removal of undesired high-frequency components. The filter $H_1(f)$ 802 is a high-pass filter, therefore high frequency undesired signals go through the feed forward and cancel out on the sampling capacitor, thus reducing aliasing. The voltage buffer 804 (unity gain amplifier) shown in FIG. 8 may be used to reduce or prevent noise current of resistor R3 from reaching the input. This can be important when the driving impedance is very high.

FIG. 9 illustrates an exemplary feed forward circuit 900 comprising a second order high-pass $H_1(f)$ 902. In this implementation, the filter $H_1(f)$ 902 creates more attenuation for out of band signals and therefore provides more alias suppression.

FIG. 10 illustrates an exemplary feed forward circuit 1000 comprising a band-stop filter $H_1(f)$ 1002. This implementation of the feed forward circuit is especially useful when the switched capacitor sampling operation happens at the front end of a signal chain, like a sub-sampling mixer where only a narrow frequency band (around a certain harmonic of the clock) is desired to be sampled or down-converted. In this case, the filter $H_1(f)$ 1002 is a band-stop filter and is used for the case where the desired signal is bandpass. Therefore, frequencies around the desired signal are attenuated and lower and higher frequencies pass through to be cancelled. The sub-sampling mixer can be used to down-convert an RF signal from integer multiples of a sampling clock frequency to baseband.

Figure 11:
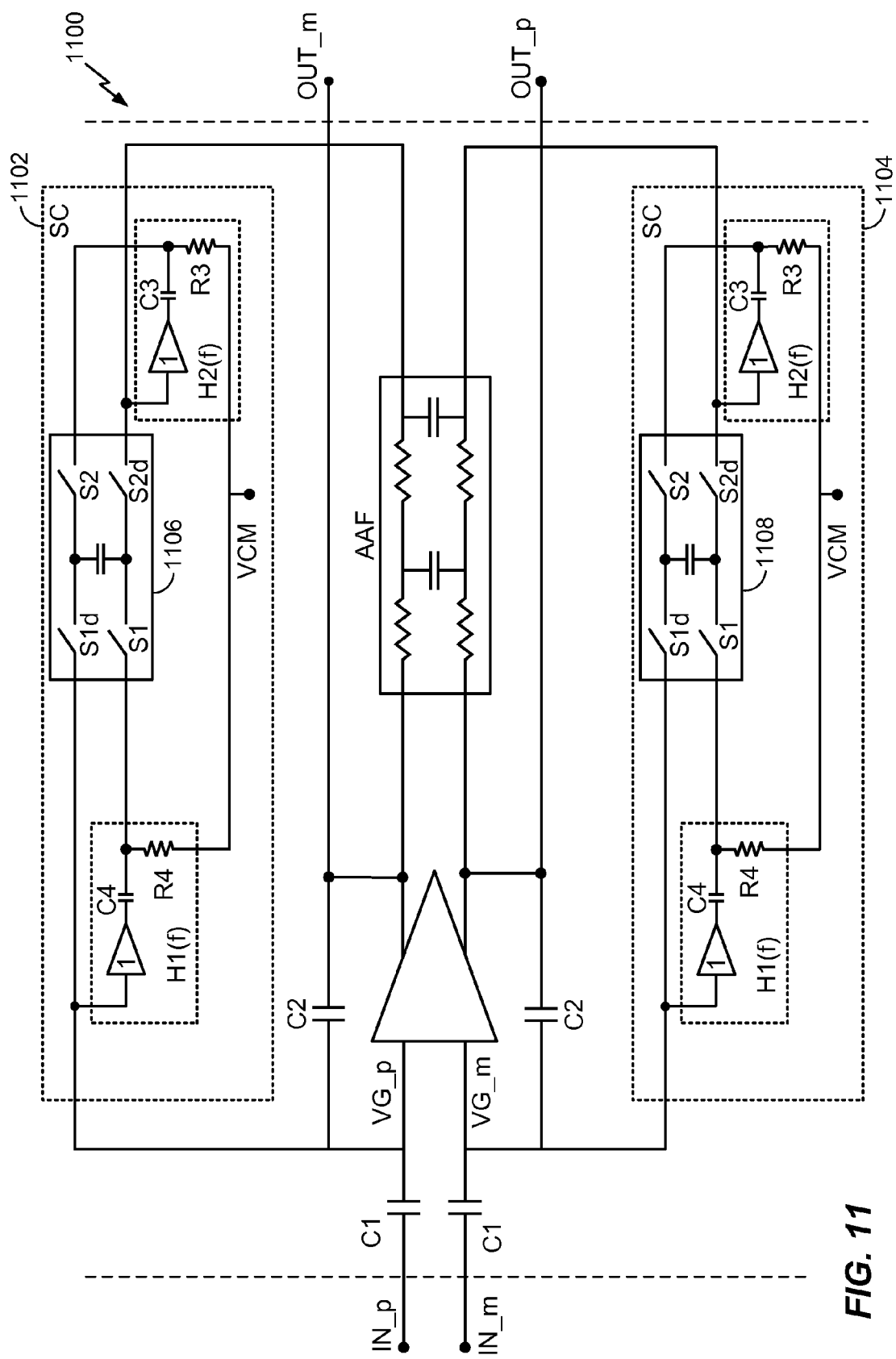
FIG. 11 illustrates an exemplary DC blocking amplifier comprising a feed forward circuit.

FIG. 11 illustrates an exemplary DC blocking amplifier 1100 comprising feed forward circuits 1102 and 1104. In this implementation, a hybrid amplifier uses capacitors to create the impedances at the input and in the feedback to eliminate the off-chip capacitors. In order to set the input common-mode and to provide a differential DC feedback so that offset voltages do not get amplified by the open-loop gain causing DC saturation of the opamp output, switched capacitor circuits 1106 and 1108 are used to create a large effective resistance. Since the Opamp is not ideal, there will be a finite voltage across its virtual ground input. The switched capacitor's sampling operation can sample any high frequency components at the virtual ground of the Opamp and alias it down to the baseband. However, this effect can be greatly attenuated by employing the feed forward filter $H_1(f)$ as shown in FIG. 11

The opamp may still have high-frequency signals at its output, which can alias in the switched capacitor, but this is easily addressed by the addition of an anti-aliasing filter (shown as AAF), and/or the second feed-forward filter $H_2(f)$ at the output of the opamp. The noise of the AAF filter is non-critical as long as it is small compared to the very large voltage noise of the equivalent resistance of the switched capacitor. Similarly the distortion is relatively non-critical as well as it is low-pass filtered with a corner frequency below the signal band of interest.

The exemplary embodiments allow for feed-forward filtering that suppresses aliases caused by sampling in hybrid circuits and can improve the alias suppression in ADC's where adequate anti-aliasing is not present. In addition, alias attenuation for sub-sampling mixers can relax the Q (Quality factor) requirements of the bandpass anti-aliasing filters before the mixers.

Improving Power Supply Noise Rejection and Distortion

Figure 12:
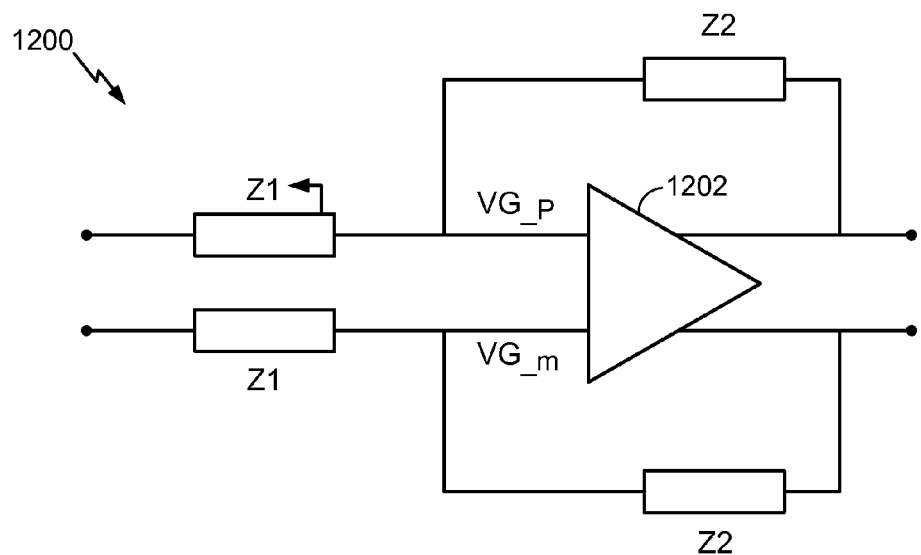
FIG. 12 shows a conventional programmable gain amplifier designed for high linearity.
Figure 13:
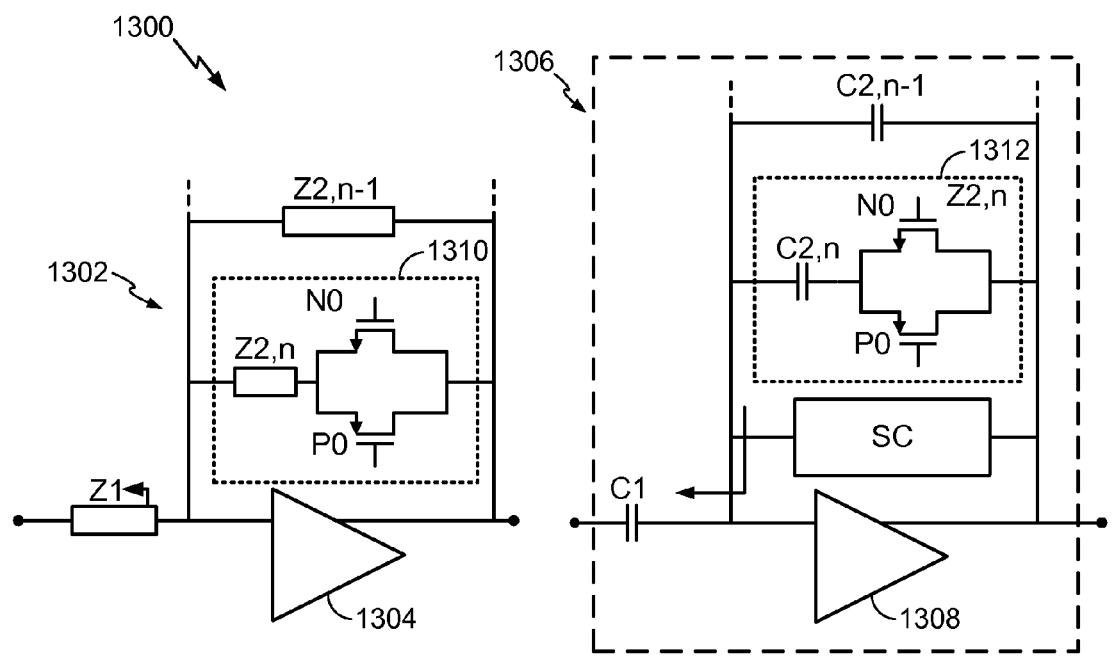
FIG. 13 shows exemplary amplifier configurations for programmable gain control.
Figure 14:
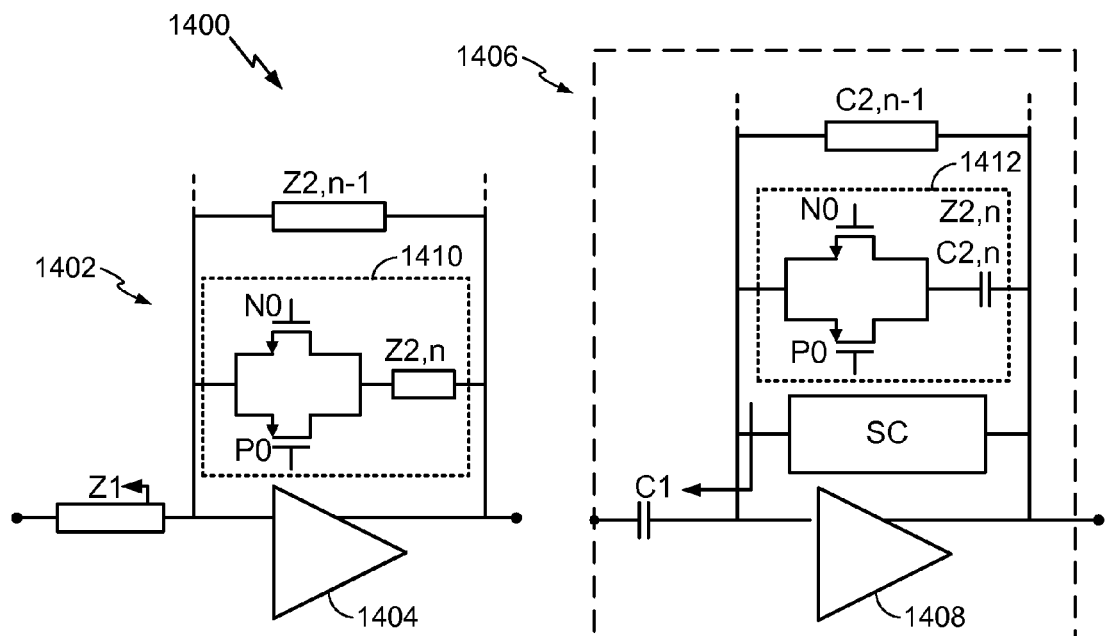
FIG. 14 shows exemplary amplifier configurations for programmable gain control.

FIGS. 12-14 illustrate exemplary embodiments configured to improve power supply rejection and distortion associated with an amplifier, for example, a DC blocking amplifier as disclosed above.

FIG. 12 shows a conventional programmable gain amplifier 1200 designed for high linearity. For example, an amplifier circuit 1200 utilizes an amplifier 1202. Gain control can be performed by changing the feedback impedance Z2, the input impedance Z1, or both Z1 and Z2 to change the ratio Z2/Z1. If the feedback impedance is high, the impedance at virtual ground VG_p and VG_m will be high as well.

FIG. 13 shows exemplary amplifier configurations 1300 for programmable gain control. For example, amplifier configuration 1302 utilizes amplifier 1304 and input impedance Z1. Amplifier configuration 1306 is a DC blocking configuration as disclosed above and utilizes amplifier 1308 input capacitance C1. It will be assumed that gain control is done by changing the feedback impedance Z2 (although this can be done at Z1 as well). In the configuration 1302, a bank of switches 1310 operate to connect/disconnect different impedances Z2,n to provide programmable gain control In the DC blocking configuration 1306, the bank of switches 1312 are used to connect/disconnect different capacitances C2,n to provide programmable gain control. In these configurations, the switch banks are placed at the output side of the amplifiers 1304 and 1308. Note that although FIG. 13 shows complementary switches the embodiments apply equally well in cases where only NMOS or PMOS switches are used.

FIG. 14 shows exemplary amplifier configurations 1400 for programmable gain control. For example, amplifier configuration 1402 utilizes amplifier 1404 and input impedance Z1. Amplifier configuration 1406 is a DC blocking configuration as disclosed above and utilizes amplifier 1408 input capacitance C1. It will be assumed that gain control is done by changing the feedback impedance Z2. In the configuration 1402, a bank of switches 1410 operate to connect/disconnect different impedances Z2,n. In the DC blocking configuration 1406, the bank of switches 1412 are used to connect/disconnect different capacitances C2,n. In these implementations, the bank of switches is located at the virtual ground side of the amplifiers 1404 and 1408.

The configurations 1402 and 1406 have the advantage that the virtual ground has low voltage swing; as a result lower distortion will be introduced by the signal dependant Ron of the switches when they are ON. The switches may introduce small leakage currents. These will pass through the large resistance and produce a DC offset. In applications that are sensitive to DC offset, it can be reduced as explained below.

One example of high feedback impedance (Z2) is the DC-blocking amplifier (disclosed above) where the only DC path for current to reach the virtual grounds from the outputs of the opamp is the very high impedance R_VCM (for example, as implemented by the switched capacitor circuit).

The leakage currents in switches N0, P0 have a constant (DC) component and also an AC component, which is a function of the input signal or the noise. The constant (DC) leakage currents may be more of a concern for the configuration 1400 than in the configuration 1300, because in the configuration 1400 the leakage goes directly to the virtual ground with high impedance, whereas in the configuration 1500 the capacitor blocks the DC component. The AC leakage currents reach the virtual ground in both configurations 1300 and 1400.

If a particular branch of feedback impedance bank is OFF (i.e. Z2,n), the gate of PMOS device is connected to the power supply. The PMOS device is OFF, with a negative Vgs. When deep sub-micron MOS devices are biased with negative Vgs (for NMOS and positive Vgs for PMOS), there is a drain leakage current that is proportional to gate voltage known as Gate Induced Drain Leakage (GIDL) phenomena. The gm in this region is a strong function of Vds and temperature.

The power supply noise (connected to the gate of the OFF PMOS) is converted to AC current through the transconductance of the off PMOS transistors via the GIDL effect and appears as AC current at the virtual grounds VG_p and VG_m.

When operating with high impedance levels (the DC-blocking amplifier as an example), this noise current which is different for positive and negative path due to random mismatches can cause strong differential signal at the virtual ground and subsequently at the output. The transfer function of noise from the supply that powers the PMOS devices to the output is a linear function of the gm of the off devices. The gm of the off device which follows the negative slope due to the GIDL phenomena is actually a function of Vgs and Vds of the device as well as an exponential function of temperature. As a result, the transfer function from Vdd to the output also becomes signal dependant leading to strong gain from supply noise to output. Since the Vds of the off switches follows the signal swing, this may also cause distortion, which can be addressed by the embodiments of FIG. 15.

Figure 15:
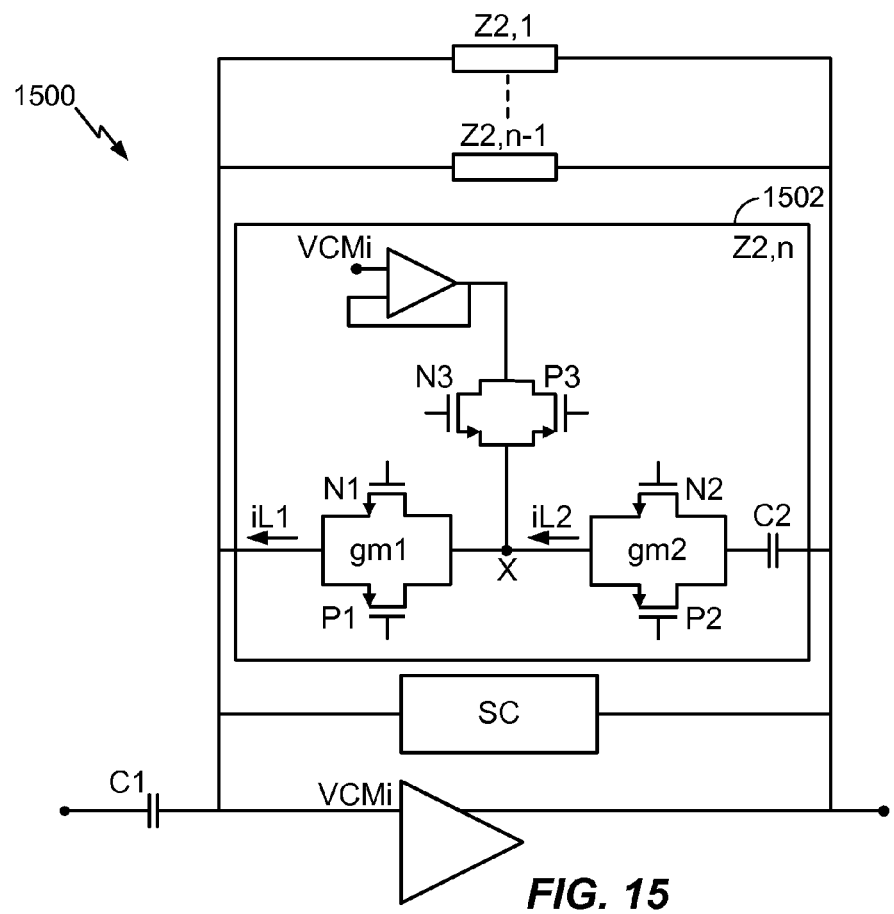
FIG. 15 shows an exemplary implementation of a DC blocking amplifier having high feedback impedance to improve power supply noise rejection and distortion.

FIG. 15 shows an exemplary implementation of a DC blocking amplifier 1500 having high feedback impedance (Z2) to improve power supply noise rejection and distortion. For example, the amplifier 1500 comprises n number of Z2 impedances, such as indicated at 1502. In this implementation, the switches N1, P1, N2, P2 are turned ON and switches N3, P3 are turned OFF when capacitor C2,n is needed in the feedback and becomes a part of Z2.

When C2,n is not needed, the switches N1, P1, N2, P2 are turned OFF and switches N3, P3 are turned ON. The role of N3, P3 is to set the voltage of node X equal to the "VCMI" or input common mode of the opamp. Therefore the Vds=0 for the two off switches N1 and P1, and Vgs=cte for OFF switches P2, N2. This reduces the GIDL transconductance of P1 and N1 by several orders of magnitude.

The switches N2, P2 are also off. Although the Vds of N2, P2 is not zero and therefore there will be considerable gm2 present (GIDL), and therefore iL2 is nonzero, but since the N3, P3 is ON, the impedance of the path to VCM1 through N3, P3 is much lower than the impedance looking into the OFF devices N1, P1 and this noise current iL2 does not reach the virtual ground. The impedance at node X is very high and the AC currents very small when the N3, P3 switch is on. Consequently the voltage follower shown in the figure that buffers VCMi is not required in many applications.

Figure 16:
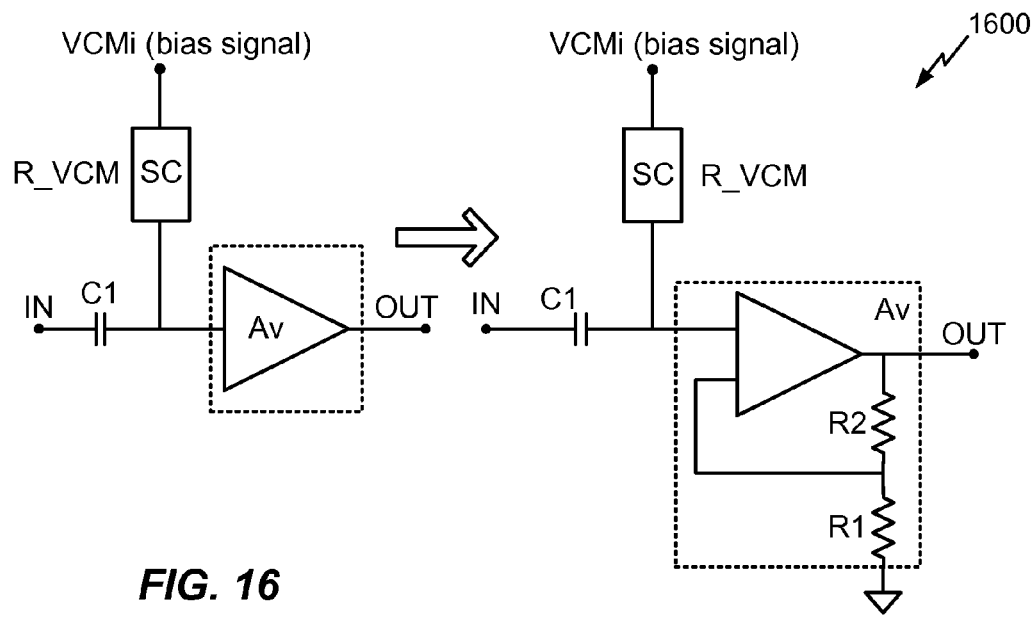
FIG. 16 shows alternate exemplary embodiments of an amplifier.

FIG. 16 shows alternate exemplary embodiments 1600 of an amplifier. In the embodiments 1600, the large resistance R_VCM is connected to the amplifier input, but does not provide a feedback path from the amplifier output. The input common-mode voltage of the amplifier is set through the resistance R_VCM, which provides a large resistance in the Giga Ohms range. In one implementation, the resistance R_VCM is provided by the switched capacitor circuit disclosed above.

Figure 17:
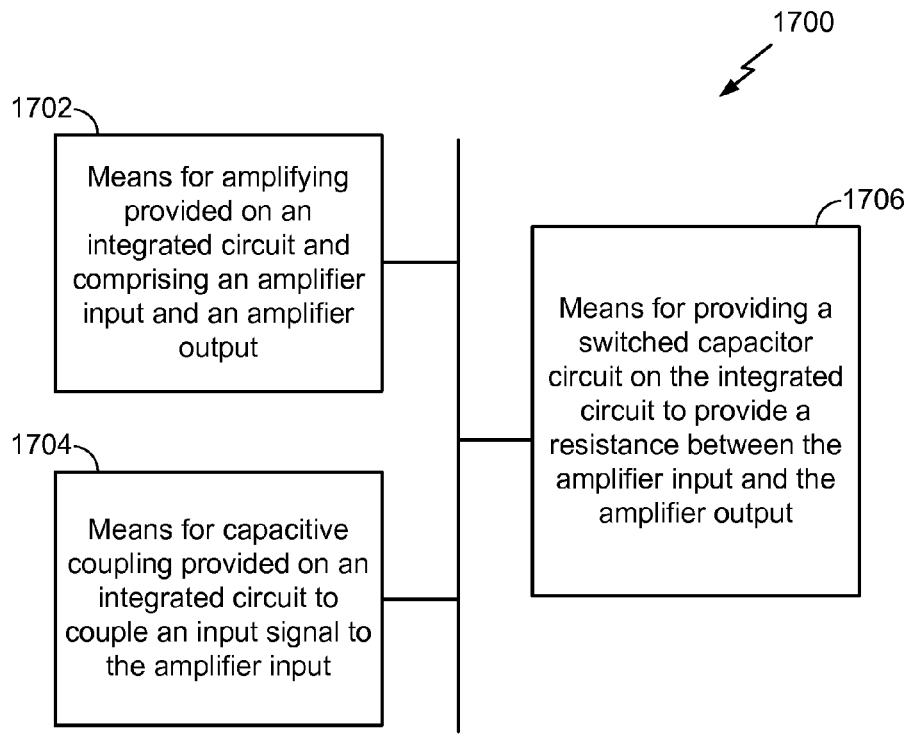
FIG. 17 shows an exemplary amplifier apparatus configured to eliminate off chip capacitors.

FIG. 17 shows an amplifier apparatus 1700 configured to reduce external components. For example, the apparatus 1700 is suitable for use to amplify an audio signal in a user device. In an aspect, the apparatus 1700 is implemented by one or more modules of an integrated circuit configured to provide the functions as described herein. For example, in an aspect, each module comprises hardware and/or hardware executing software.

The apparatus 1700 comprises a first module comprising means (1702) for amplifying provided on an integrated circuit and comprising an amplifier input and an amplifier output, which in an aspect comprises the amplifier 204.

The apparatus 1700 also comprises a second module comprising means (1704) for capacitive coupling provided on an integrated circuit to couple an input signal to the amplifier input, which in an aspect comprises the capacitor C1 shown in FIG. 2.

The apparatus 1700 also comprises a third module comprising means (1706) for providing a switched capacitor circuit on the integrated circuit to provide a resistance between the amplifier input and the amplifier output, which in an aspect comprises the switched capacitor circuit 202.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
an integrated circuit comprising:
an amplifier having an amplifier input and an amplifier output;
a capacitor connected to the amplifier input and configured to receive an input signal; and
a switched capacitor circuit comprising:
a switching capacitor having first and second terminals coupled to a plurality of switches, wherein the plurality of switches are configured to couple the first and second terminals of the switching capacitor to:
the amplifier input and a first bias voltage, respectively, during a first phase; and
a second bias voltage and the amplifier output, respectively, during a second phase non-overlapping with the first phase.

2. The apparatus of claim 1, the input signal comprising a continuous time input signal.

3. The apparatus of claim 1, the amplifier comprising one of a differential amplifier, buffer amplifier and gain stage.

4. The apparatus of claim 1, further comprising at least one anti-aliasing filter coupled between the switched capacitor circuit and the amplifier.

5. The apparatus of claim 1, the switched capacitor circuit configured as a feed-forward circuit to suppress aliasing.

6. The apparatus of claim 5, the feed-forward circuit comprising at least one continuous time filter.

7. The apparatus of claim 6, the at least one continuous time filter comprising at least one of a high-pass, band-pass, band-stop, and low-pass filter.

8. The apparatus of claim 1, further comprising at least one impedance circuit coupled in parallel with the switched capacitor circuit and selectively configured by one or more switches to reduce at least one of power supply noise and distortion.

9. An apparatus comprising:
    means for amplifying provided on an integrated circuit and comprising an amplifier input and an amplifier output;
    means for capacitive coupling provided on an integrated circuit to couple an input signal to the amplifier input; and
    means for providing a switched capacitor circuit on the integrated circuit to provide a resistance between the amplifier input and the amplifier output, the means for providing a switched capacitor circuit comprising means for selectively coupling first and second terminals of a switching capacitor to the amplifier input and a first bias voltage, respectively, during a first phase, and for selectively coupling the first and second terminals to a second bias voltage and the amplifier output, respectively, during a second phase.

10. The apparatus of claim 9, the input signal comprising a continuous time input signal.

11. The apparatus of claim 9, further comprising at least one means for anti-alias filtering coupled between the means for providing the switched capacitor circuit and the means for amplifying.

12. The apparatus of claim 9, the means for providing a switched capacitor circuit comprising means for providing a feed-forward circuit to suppress aliasing.

13. The apparatus of claim 12, the means for providing the feed-forward circuit comprising at least one continuous time filter selected from a set of filters comprising high-pass, band-pass, band-stop, and low-pass filters.

14. The apparatus of claim 9, further comprising means for providing at least one impedance circuit coupled in parallel with the means for providing the switched capacitor circuit and selectively configured by one or more switches to reduce at least one of power supply noise and distortion.

15. The apparatus of claim 1, further comprising:
    a filter having a high-pass, low-pass, bandpass, or band-reject transfer characteristic between first and second nodes, wherein the first and second nodes are coupled to the first and second terminals of the switching capacitor, respectively.

16. The apparatus of claim 15, the filter comprising:
    a buffer having an output and an input coupled to the second node;
    a filter capacitor coupling the output of the buffer to the first node; and
    a filter resistor coupling the first node to the second bias voltage.

17. The apparatus of claim 15, the filter comprising:
    a buffer having an output and an input coupled to the second node;
    a first filter capacitor coupling the output of the buffer to an intermediate node;
    a first filter resistor coupling the intermediate node to the second bias voltage;
    a second filter capacitor coupling the intermediate node to the first node; and
    a second filter resistor coupling the first node to the second bias voltage.

18. The apparatus of claim 15, the filter comprising:
    a buffer having an output and an input coupled to the second node;
    a filter resistor coupling the output of the buffer to the first node; and
    a series inductor-capacitor circuit coupling the first node to the second bias voltage.

19. The apparatus of claim 1, wherein the first and second bias voltages correspond to the same voltage.

* * * * *